(12) United States Patent
Lee

(10) Patent No.: US 7,934,047 B2
(45) Date of Patent: Apr. 26, 2011

(54) MEMORY MODULE AND MEMORY SYSTEM

(75) Inventor: Joong-Ho Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 625 days.

(21) Appl. No.: 12/013,845

(22) Filed: Jan. 14, 2008

(65) Prior Publication Data

US 2008/0307170 A1 Dec. 11, 2008

(30) Foreign Application Priority Data

Jun. 11, 2007 (KR) ........................ 10-2007-0056936

(51) Int. Cl.
*G06F 13/00* (2006.01)
*G06F 13/28* (2006.01)

(52) U.S. Cl. .................. 711/5; 711/170; 711/E12.002

(58) Field of Classification Search .............. 711/5, 170, 711/E12.002
See application file for complete search history.

(56) References Cited

U.S. PATENT DOCUMENTS

| | | | |
|---|---|---|---|
| 6,515,922 B1 | 2/2003 | Yamagata | |
| 6,809,975 B2 | 10/2004 | Yamaoka et al. | |
| 7,051,130 B1 | 5/2006 | Horowitz et al. | |
| 7,619,912 B2 * | 11/2009 | Bhakta et al. | 365/51 |
| 2006/0126369 A1 * | 6/2006 | Raghuram | 365/51 |
| 2006/0129755 A1 * | 6/2006 | Raghuram | 711/105 |
| 2006/0198178 A1 * | 9/2006 | Kinsley et al. | 365/52 |
| 2007/0008763 A1 | 1/2007 | Choi | |
| 2007/0140040 A1 | 6/2007 | Aoki et al. | |
| 2007/0274033 A1 | 11/2007 | Hwang | |
| 2008/0084769 A1 * | 4/2008 | RaghuRam et al. | 365/191 |
| 2008/0235444 A1 * | 9/2008 | Gower et al. | 711/105 |

FOREIGN PATENT DOCUMENTS

| | | |
|---|---|---|
| JP | 2001-274323 | 10/2001 |
| JP | 2002-289636 | 10/2002 |
| JP | 2003-317499 | 11/2003 |
| JP | 2007-164599 | 6/2007 |
| KR | 1020060117488 A | 11/2006 |

* cited by examiner

*Primary Examiner* — Matt Kim
*Assistant Examiner* — Edward J Dudek, Jr.
(74) *Attorney, Agent, or Firm* — Baker & McKenzie LLP

(57) ABSTRACT

A memory module includes a plurality of ranks that each include a first pin group and a second pin group for receiving external pin signals, and a rank selecting unit included in each of the plurality of ranks, the rank selecting unit configured to output different rank pin signals to each rank by using signals of the first pin group.

12 Claims, 5 Drawing Sheets

FIG.5

| HOST | FIRST RANK | SECOND RANK | THIRD RANK | FOURTH RANK |
|---|---|---|---|---|
| pin 0 | Rpin 0 | Rpin 3 | Rpin 2 | Rpin 1 |
| pin 1 | Rpin 1 | Rpin 0 | Rpin 3 | Rpin 2 |
| pin 2 | Rpin 2 | Rpin 1 | Rpin 0 | Rpin 3 |
| pin 3 | Rpin 3 | Rpin 2 | Rpin 1 | Rpin 0 |

US 7,934,047 B2

MEMORY MODULE AND MEMORY SYSTEM

CROSS-REFERENCES TO RELATED APPLICATION

The present application claims priority under 35 U.S.C. 119(a) to Korean Patent Application number 10-2007-0056936, filed on Jun. 11, 2007, in the Korean Intellectual Property Office, the contents of which are incorporated herein by reference in their entirety as if set forth in full.

BACKGROUND

1. Technical Field

The embodiments described herein relate to a memory module, and more particularly, to a memory module including a plurality of ranks.

2. Related Art

In general, semiconductor memories are manufactured in the forms of modules. A module is a functional unit having an independent function in a system. A conventional memory module may include one or more ranks according to the structure of a memory system. The rank includes a plurality of semiconductor element packages that are controlled in the same condition by one chip selection signal 'CS' or one chip enable signal 'CE'.

Specifically, each rank having a plurality of semiconductor element packages are mounted to a printed circuit board (PCB), and the PCB is connected to, for example, a panel by a plurality of connection terminals. In a conventional semiconductor memory, the chip selection signal 'CS' or the chip enable signal 'CE' is used to identify the rank.

However, as the number of ranks mounted to the memory module increases, the number of pins of the memory module for supplying the chip selection signals 'CS' or the chip enable signals 'CE' required to select the ranks also increases. It is difficult to add pins to each rank since the number of pins provided in the memory module is limited.

SUMMARY

A memory module that allows the selection of a rank without a separate rank selection pin is disclosed herein, as is a memory system that allows the selection of a rank without a separate rank selection pin.

According to one aspect, a memory module includes n ranks (n is an integer number that is equal to or greater than 2) each of which includes a first pin group and a second pin group for receiving external pin signals, and a rank selecting unit included in each of the plurality of ranks, the rank selecting unit configured to output different rank pin signals to each rank by using signals of the first pin group.

The first pin group can include n pins corresponding to the n ranks. The rank selecting unit can include n multiplexers corresponding to the n ranks. The multiplexer can multiplex the signals of the first pin group by using predetermined register signals for each rank, and output the rank pin signals. The predetermined register signals can be as n register signals, which are MRS or EMRS signals. The multiplexer can output any one of the signals of the first pin group as the rank pin signal in response to one of the n register signals that is activated.

According to another aspect, a memory module includes a plurality of ranks (n is an integer number that is equal to or greater than 2) that each include a first pin group and a second pin group each of which is physically connected to external pins in the same connection method, and a rank selecting unit that is coupled with each of the plurality of ranks, the rank selecting unit configured to multiplex the signals received via the first pin group that, and to output different rank pin signals based on the multiplexed, received signals.

According to still another aspect, a memory system includes a host that provides external pin signals, and a memory module coupled with the host, the memory module comprising a plurality of ranks that each have a first pin group and a second pin group for receiving the external pin signals. In the memory system, each of the ranks includes a rank selecting unit that receives the external pin signals and outputs different rank pin signals to the first pin group.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 5 is a table illustrating rank pin signals shown in FIG. 4.

DETAILED DESCRIPTION

According to the embodiments described herein, it is possible to select ranks without separate chip selection signal pins. That is, a host can provide rank signals for identifying ranks to a memory module during an initializing operation. The rank signals can then be stored in a register in the memory module. In this way, it is possible to selectively control the ranks by intercrossing signals corresponding to the register signals for the ranks. It is also possible to selectively control the operations of the ranks without a separate rank selection pin by using a simple multiplexing method based on register information. In addition, it is possible to provide a system including a host for controlling the memory module.

Such a memory system will be described in detail below.

Figure 1:
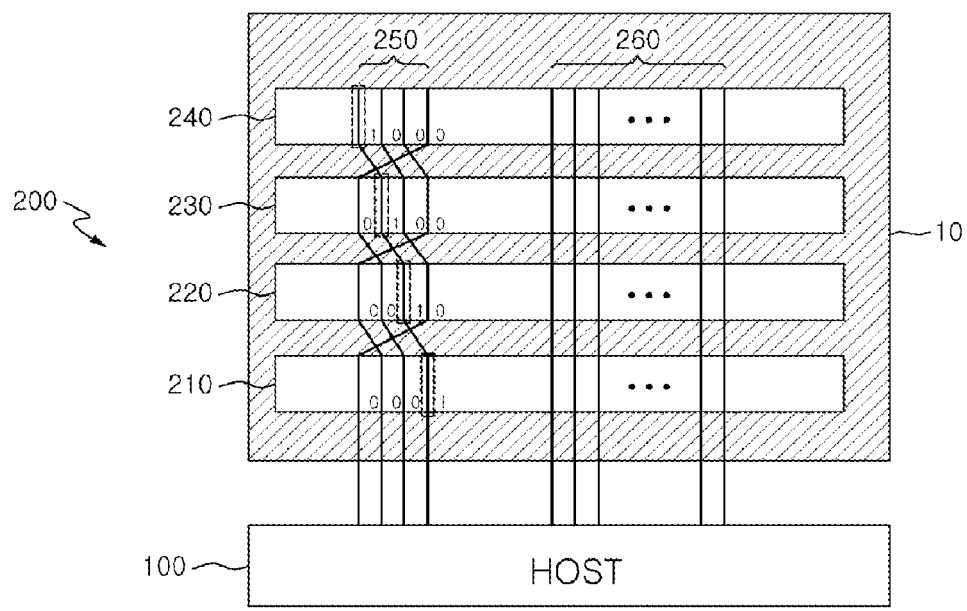
FIG. 1 is a block diagram illustrating a memory module according to one embodiment.

For example, FIG. 1 is a block diagram illustrating an example memory system 101 configured in accordance with one embodiment. Referring to FIG. 1, the memory system 101 can include a host 100 and a memory module 200.

The host 100 can be provided outside the memory module 200 and can be configured to control the operation of the memory module 200. The term "host" is used herein to broadly refer to a controller or the like, which can comprise one or multiple chips or circuits. For instances, in the example, the host 100 can be a chip set circuit unit that directly communicates with the memory module 200.

The host 100 can be connected to the memory module 200 and can supply signals for controlling the operation of the memory module 200. For example, the host 100 can be configured to supply commands and address signals to the memory module 200. However, in this embodiment, a separate chip selection signal ('CS') pin is not provided between the host 100 and the memory module 200.

Next, the structure of the memory module 200 will be described below. The memory module 200 can include a plurality of ranks 210 to 240, a first pin group 250, and a second pin group 260.

Specifically, the memory module 200 according to this embodiment can include first to fourth ranks 210 to 240, and the ranks 210 to 240 can be connected to each other by wiring lines. Each rank 210 to 240 can include a plurality of semiconductor device packages (not shown). The ranks 210 to 240 can be connected to the host 100 and can receive signals from the host 100.

The chip selection signal ('CS') pin for operating the ranks 210 to 240 is not provided as in conventional memory modules, but wiring lines for connecting the pins of the ranks 210 to 240 are physically intercrossed. That is, when the ranks 210 to 240 receive signals from the host 100, the same signal is transmitted to different pins of the ranks 210 to 240. In other words, the wiring lines for connecting the pins of the ranks 210 to 240 can be physically intercrossed such that the same signal is transmitted to different pins of the ranks 210 to 240, thereby identifying the rank responding to the signal.

In this embodiment, the pin group for identifying the ranks is exemplified as the first pin group 250. The number of pins included in the first pin group 250 can therefore correspond to the number of ranks 210 to 240, that is, the first pin group 250 can include n (n is an integer number equal to or greater than 2) pins corresponding to n ranks. Therefore, in the example of FIG. 1, since the number of ranks 210 to 240 is four, the number of pins included in the first pin group 250 is four. In this embodiment, the first pin group 250 includes command pins and address pins, but the embodiments described herein are not limited thereto. In addition, the second pin group 260 can include the other command pins and address pins and data pins except for the first pin group 250.

In this embodiment, the host 100 can be configured to supply signal '0001' to the first pin group 250. Then, the first rank 210 receives the signal '0001'. However, since the wiring lines are intercrossed, the second rank 220 receives signal '0010' as to the signal '0001' output from the host 100. Similarly, the third rank 230 receives signal '0100' as to the signal '0001' output from the host 100, and the fourth rank 240 receives signal '1000' as to the signal '0001' output from the host 100. Therefore, the host 100 can identify the ranks 210 to 240 on the basis of the signals received by the ranks 210 to 240.

In this way, the memory system 101 can selectively control the ranks without a separate chip selection signal pin by physically connecting the pins with wiring lines such that the wiring lines are intercrossed. However, since the lengths of the wiring lines for connecting the ranks 210 to 240 depend on a connection method of the wiring lines, delay can occur in the signals. That is, line delay due to the connection method illustrated in FIG. 1 can cause the asymmetry of signals, which can hinder high-speed operation.

Figure 2:
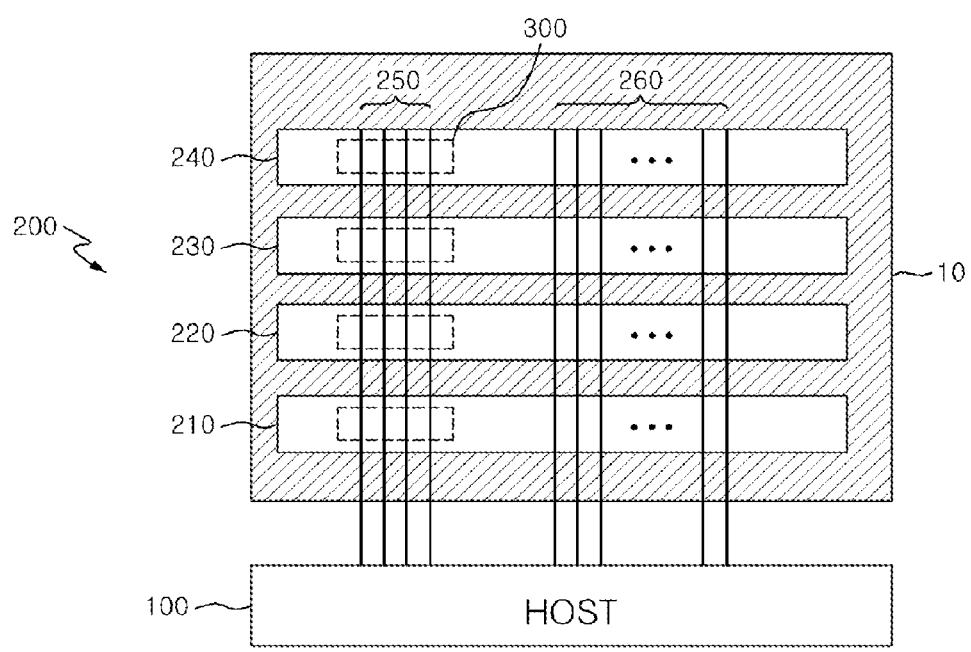
FIG. 2 is a block diagram illustrating a memory module according to another embodiment.

FIG. 2 therefore illustrated a memory system 201 configured in accordance with another embodiment in which the signal line are not intercrossed. In describing system 201, a description of the structures also that are the same or similar as those shown in FIG. 1 will be omitted, and only the difference between the systems will be described.

Referring to FIG. 2, in the memory system 201, the host 100 and the ranks 210 to 240 are connected to each other by wiring lines such that all the pins of the ranks 210 to 240 receive the same signals. A rank selecting unit 300 can then be provided across the ranks 210 to 240 of the memory module 200.

Specifically, in the memory system 201, the host 100 and the ranks of the memory module 200 are connected to each other by wiring lines such that the same signal is transmitted to the same pin group 250 or 260, thereby reducing the line delay due to the connection between the host 100 and the memory module 200. Similar to the above-described embodiment, in this embodiment, the memory module 200 can identify the ranks 210 to 240 without a separate chip selection signal ('CS') pin. That is, the ranks 210 to 240 can receive the same signal from the host 100. However, predetermined pins of the ranks 210 to 240, for example, the first pin groups 250 of the ranks 210 to 240 receive the same signal, but the signals are differently matched with each other in order to discriminate the ranks. For this reason, the rank selecting unit 300 can be provided in each rank 210 to 240 of the memory module 200.

The rank selecting unit 300 will be described in detail with reference to FIG. 3.

Figure 3:
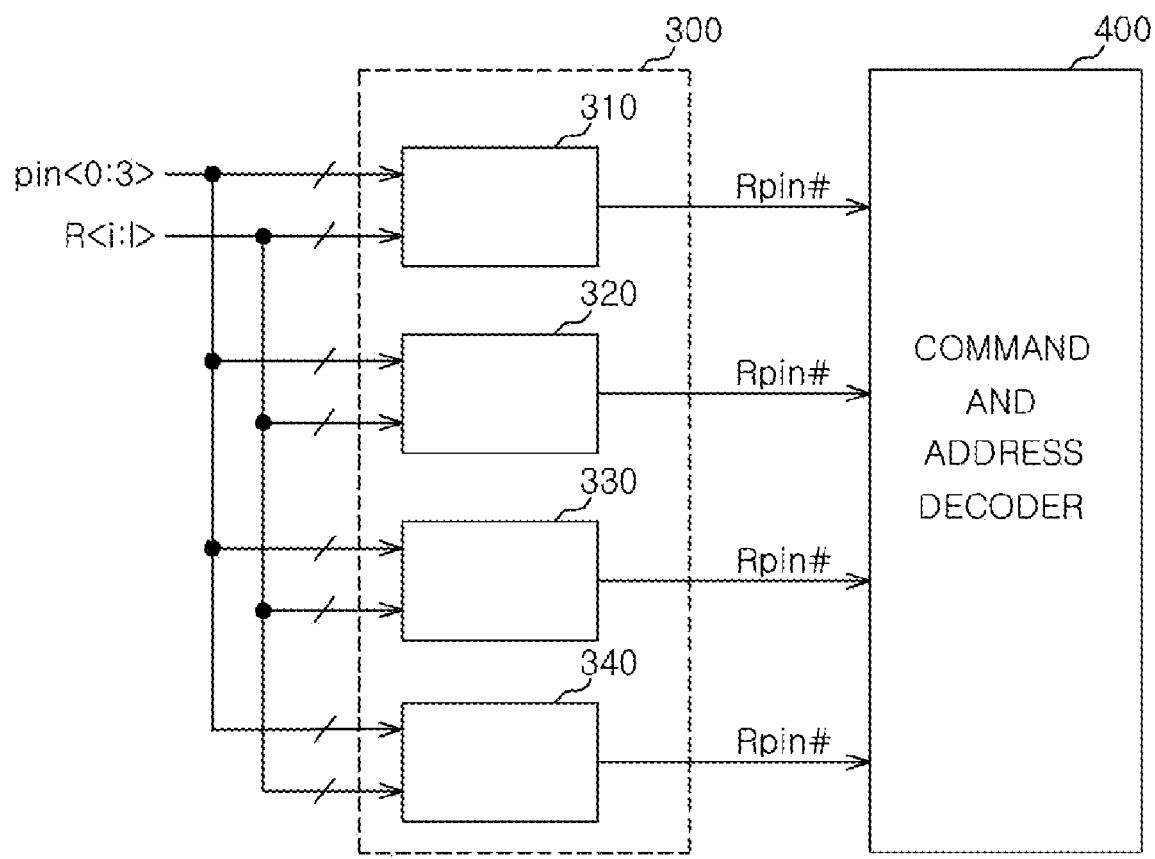
FIG. 3 is a block diagram illustrating a rank selecting unit that can be included in the module shown in FIG. 2.

Referring to FIG. 3, the rank selecting unit 300 can include four multiplexers 310 to 340. It will be understood that while four multiplexers 310 to 340 are provided in this example, the number of multiplexers can correspond to n ranks.

The rank selecting unit 300 can be configured to output rank pin signals 'Rpin#' in response to first to fourth rank register signals 'R<i:1>' and first to fourth pin signals 'pin0' to 'pin3', which are pin signals of the first pin group 250.

Specifically, the first to fourth multiplexers 310 to 340 provided in the rank selecting unit 300 can be configured to output any one of the first to fourth pin signals 'pin0' to 'pin3' responding to the register signals 'R<i:1>' as the rank pin signal 'Rpin#'. Different rank pin signals 'Rpin#' can be supplied to the ranks 210 to 240 according to whether the rank register signals 'R<i:1>' are activated.

The register signals 'R<i:1>' can be stored signals as predetermined rank signals. That is, the host (see reference numeral 100 in FIG. 2) can be configured to provide signals for identifying the ranks 210 to 240 to the ranks 210 to 240 when the memory module 200 is initialized. The signals can be stored in a register of the memory module 200, which can serve as the register signals 'R<i:1>'. The register signals 'R<i:1>' can be MRS (mode register set) signals or EMRS (extended mode register set) signals, but the embodiments described herein are not limited thereto.

In this way, it is possible to provide the rank pin signal 'Rpin#' in response to an activated register signal 'R<i:1>' of the received n register signals 'R<i:1>'. That is, it is possible to provide the rank pin signal 'Rpin#' for identifying the ranks by multiplexing the first to fourth pin signals 'pin0' to 'pin3' in response to the register signals 'R<i:1>'. Therefore, the host (see reference numeral 100 in FIG. 2) can identify the ranks 210 to 240 on the basis of different rank pin signals 'Rpin#' provided to the ranks 210 to 240.

The rank pin signals 'Rpin#' of the ranks 210 to 240 can be provided to a command and address decoding unit 400, and the command and address decoding unit 400 can be configured to decode the rank pin signals to be suitable for the ranks 210 to 240.

Figure 4:
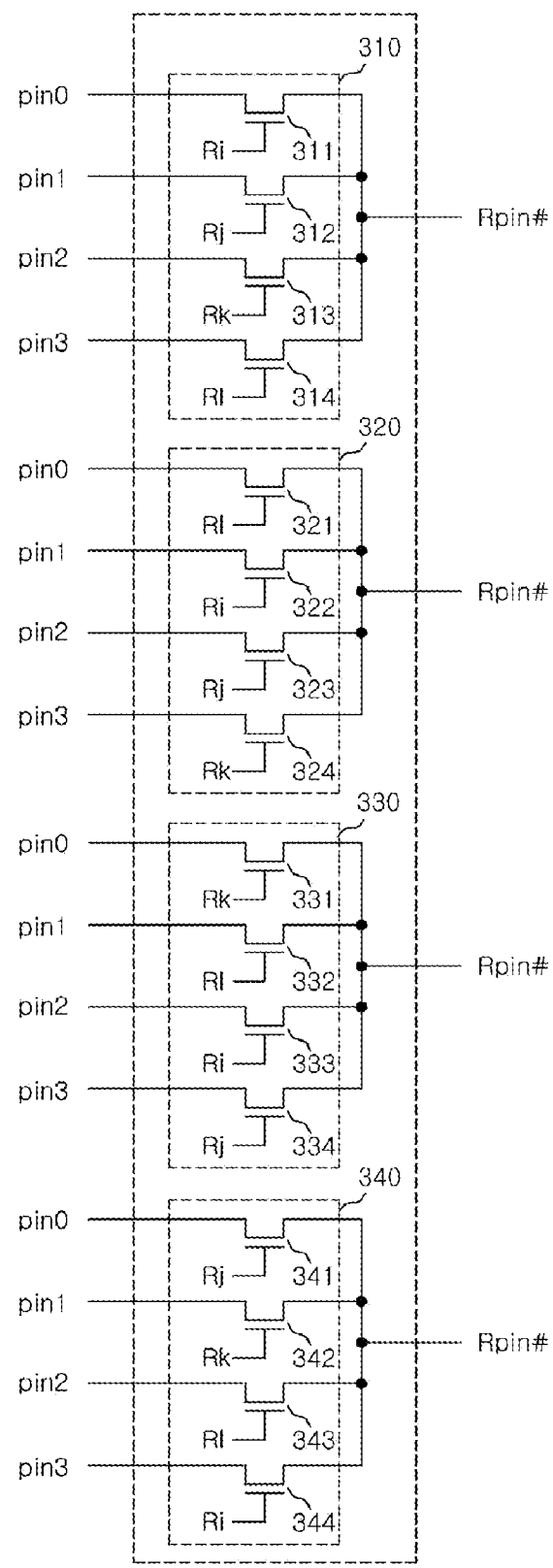
FIG. 4 is a detailed circuit diagram illustrating a multiplexer that can be included in the unit shown in FIG. 3.

FIG. 4 is a detailed circuit diagram illustrating the rank selecting unit 300. As described above, the rank selecting unit 300 can include the first to fourth multiplexers 310 to 340. As further described above, each of the multiplexers 310 to 340 can receive four register signals 'R<i:1>', and outputs one of the first to fourth pin signals 'pin0' to 'pin3' that corresponds to an activated register signal 'R<i:1>' as the rank pin signal 'Rpin#'.

In this embodiment, as examples of the register signals 'R<i:1>', the first rank register signal, the second rank register signal, the third rank register signal, and the fourth rank register signal are referred to as 'Ri', 'Rl', 'Rk', and 'Rj', respectively.

Referring to FIG. 4, each multiplexer 310 to 340 can receive n signals and output one signal. The first multiplexer 310 can include first to fourth NMOS transistors 311 to 314. Each of the NMOS transistors 311 to 314 can include a gate that receives the register signal 'R<i:1>', a source that receives any one of the first to fourth pin signals 'pin0' to 'pin3' from the host (see reference numeral 100 in FIG. 2), and a drain that outputs the rank pin signal 'Rpin#'. The drains of the NMOS transistors 311 to 314 can be connected to each other. The second to fourth multiplexers 320 to 340 can have the same NMOS transistors as described above. However, the register signals 'R<i:1>' are received by the NMOS transistors of the multiplexers 310 to 340 in different orders.

For example, the NMOS transistors 311 to 314 of the first multiplexer 310 can receive the rank register signals 'Ri', 'Rj', 'Rk', and 'Rl', respectively. Meanwhile, the NMOS transistors 321 to 324 of the second multiplexer 320 can receive the rank register signals 'Rl', 'Ri', 'Rj', and 'Rk', respectively. The NMOS transistors 331 to 334 of the third multiplexer 330 can receive the rank register signals 'Rk', 'Rl', 'Ri', and 'Rj' respectively. The NMOS transistors 341 to 344 of the fourth multiplexer 340 can receive the rank register signal 'Rj', 'Rk', 'Rl', and 'Ri', respectively. That is, the multiplexers 310 to 340 receive the rank register signals 'Ri', 'Rj', 'Rk', and 'Rl' in different orders. The first to fourth multiplexers 310 to 340 are provided in each of the ranks 210 to 240.

Next, the operation of the multiplexers 310 to 340 will be described below.

In this embodiment, as an example, the second rank register signal 'Rl' can be activated to select the second rank 220. In this case, the host (see reference numeral 100 in FIG. 2) provides the first to fourth pin signals 'pin0' to 'pin3' to the first pin group 250. In the memory module 200 according to this embodiment, the pins of the first pin group 250 and the second pin group 260 are physically connected to each other by wiring lines such that the first pin group 250 and the second pin group 260 of the ranks 210 to 240 receive the same signal from the host (see reference numeral 100 in FIG. 2). Therefore, the ranks 210 to 240 receive the same first to fourth pin signals 'pin0' to 'pin3'.

First, the first to fourth multiplexers 310 to 340 respond to an activated second rank register signal 'Rl'. Therefore, the first multiplexer 310 outputs the fourth pin signal 'pin3' as the fourth rank pin signal 'Rpin3', the second multiplexer 320 outputs the first pin signal 'pin0' as the first rank pin signal 'Rpin3', the third multiplexer 330 outputs the second pin signal 'pin1' as the second rank pin signal 'Rpin1', and the fourth multiplexer 330 outputs the third pin signal 'pin2' as the third rank pin signal 'Rpin2'. That is, according to the rank selecting unit 300 of this embodiment, when the host (see reference numeral 100 in FIG. 2) provides the first to fourth pin signals 'pin0' to 'pin3', the second rank 220 can rearrange the signals in the order of the rank pin signals 'Rpin3', 'Rpin0', 'Rpin1', and 'Rpin2' and output the rearranged signals. In other words, it is possible to identify the ranks by using new rank pin signals 'Rpin#' that are matched with the first to fourth pin signals 'pin0' to 'pin3' of the first pin group 250 provided from the host (see reference numeral 100 in FIG. 2).

FIG. 5 is a table illustrating the rank pin signals 'Rpin#' shown in FIG. 4. Referring to FIG. 5, the table illustrated the pin signals matched with the ranks when the host (see reference numeral 100 in FIG. 2) provides the first to fourth pin signals 'pin0' to 'pin3'.

More specifically, in response to an activated host register signal 'Ri' provided from the host (see reference numeral 100 in FIG. 2), the rank selecting unit (see reference numeral 300 in FIG. 2) can be configured to output the first pin signal 'pin0', the second pin signal 'pin1', the third pin signal 'pin2', and the fourth pin signal 'pin3' as the first rank pin signal 'Rpin0', the second rank pin signal 'Rpin1', the third rank pin signal 'Rpin2', and the fourth rank pin signal 'Rpin3', respectively, which means that the first rank 210 is selected.

However, in response to an activated host register signal 'Rl' supplied from the host (see reference numeral 100 in FIG. 2), the rank selecting unit (see reference numeral 300 in FIG. 2) can be configured to output the first pin signal 'pin0', the second pin signal 'pin1', the third pin signal 'pin2', and the fourth pin signal 'pin3' as the third rank pin signal 'Rpin3', the first rank pin signal 'Rpin0', the second rank pin signal 'Rpin1', and the third rank pin signal 'Rpin2', respectively, which means that the second rank 220 is selected.

The third and fourth ranks 230 and 240 can be selected in the same method as described above. That is, when the rank selecting unit outputs the first pin signal 'pin0' as the third rank pin signal 'Rpin2' in response to an activated host register signal 'Rj' supplied from the host (see reference numeral 100 in FIG. 2), the third rank 230 is selected. However, when the rank selecting unit outputs the first pin signal 'pin0' as the second rank pin signal 'Rpin1' in response to an activated host register signal 'Rk' supplied from the host (see reference numeral 100 in FIG. 2), the fourth rank 240 is selected. The other rank pin signals 'Rpin#' are output in response to the activated register signals 'Rj' and 'Rk' in the same manner as described above, and thus a description thereof will be omitted.

As described above, according to this embodiment, it is possible to selectively control the ranks 210 to 240 without a separate chip selection signal pin, by simply controlling the register signals 'R<i:1>'. In addition, the host (see reference numeral 100 in FIG. 2) and the pin groups of the memory module 200 can be connected by wiring lines by the same connection structure, which makes it possible to reduce the asymmetry of signals due to a physical connection structure.

Figure 6A:
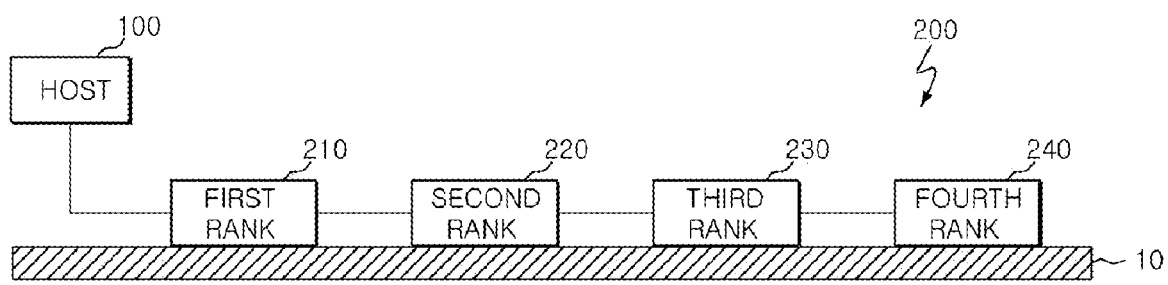
FIGS. 6A and 6B are diagrams illustrating a memory system having the memory module shown in FIG. 2 mounted thereto.
Figure 6B:
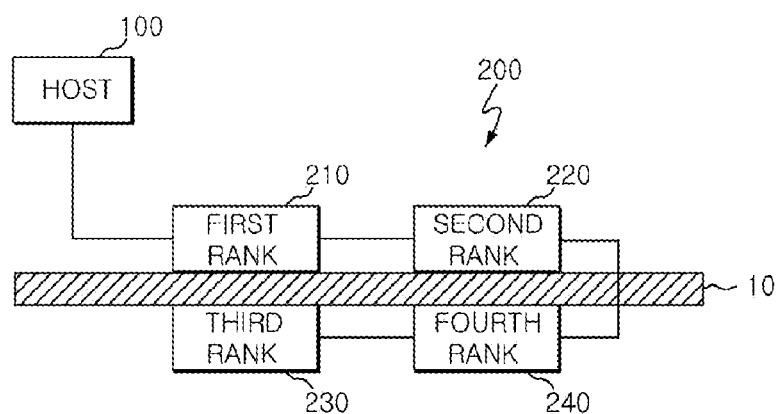

FIGS. 6A and 6B are conceptual diagrams illustrating a memory system having the memory module shown in FIG. 2 mounted thereto.

FIG. 6A shows a series of ranks 210 to 240 mounted to a PCB 10. That is, FIG. 6A shows a SIMM (single-in line memory module) in which the memory module 200 is mounted to one surface of the PCB 10.

In contrast, FIG. 6B is a DIMM (dual-in line memory module) in which a plurality of ranks 210 to 220, 230 to 240 are mounted to both surfaces of the PCB 10. In FIGS. 6A and 6B, the memory modules 200 are mounted in different structures, but the memory module 200 can be mounted in various structures depending on the embodiment.

As described in detail above, it is possible to select the ranks without a separate chip selection signal pin. That is, it is possible to supply signals for selecting the ranks by storing information for identifying ranks in the register when the memory module is initialized and multiplexing the register information. It is possible to selectively control the operations of the ranks without separate pins, by simply multiplexing register information. In addition, it is possible to provide a system including a host for controlling the memory module.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A memory module comprising:
 a plurality of ranks each including a first pin group and a second pin group for receiving external pin signals; and
 a rank selecting unit included in each of the plurality of ranks, the rank selecting unit configured to output different rank pin signals to each of the plurality of ranks using signals of the first pin group,
 wherein the rank selecting unit comprises a plurality of multiplexers corresponding to the plurality of ranks, and
 wherein each of the plurality of multiplexers is configured to multiplex the signals of the first pin group by using predetermined register signals for each rank, and to output the rank pin signals.

2. The memory module of claim 1, wherein the first pin group comprises a plurality of pins corresponding to the plurality of ranks.

3. The memory module of claim 1, wherein the predetermined register signals are MRS or EMRS signals.

4. The memory module of claim 1, wherein each of the plurality of multiplexers is configured to output one of the signals of the first pin group as the rank pin signal in response to one of the plurality of register signals that is activated.

5. A memory module comprising:
 a plurality of ranks that each include a first pin group and a second pin group each of which is physically connected to external pins in the same connection method; and
 a rank selecting unit coupled with each of the plurality of ranks, the rank selecting unit configured to multiplex the same signals received via the first pin group, and to output different rank pin signals based on the multiplexed, received signals,
 wherein the rank selecting unit comprises a plurality of multiplexers corresponding to the plurality of ranks, and
 wherein each of the plurality of multiplexers is configured to receive the same information from the external pins, to receive register signals predetermined for each rank, and to output the rank pin signals based on the received information and the predetermined register signals.

6. The memory module of claim 5, wherein the first pin group comprises a plurality of pins corresponding to the plurality of ranks.

7. The memory module of claim 5, wherein the predetermined register signals are MRS or EMRS signals.

8. The memory module of claim 5, wherein each of the plurality of multiplexers is configured to output any one of the signals of the first pin group as the rank pin signal in response to one of the plurality of register signals that is activated.

9. A memory system comprising:
 a host that provides external pin signals; and
 a memory module coupled with the host, the memory module comprising a plurality of ranks that each have a first pin group and a second pin group for receiving the external pin signals, and a rank selecting unit that receives the external pin signals and outputs different rank pin signals to the first pin group,
 wherein the rank selecting unit comprises a plurality of multiplexers corresponding to the plurality of ranks, and
 wherein each of the plurality of multiplexers is configured to multiplex the signals of the first pin group using predetermined register signals for each rank, and to output the rank pin signals.

10. The memory system of claim 9, wherein the first pin group comprises a plurality of pins corresponding to the plurality of ranks.

11. The memory system of claim 9, wherein the predetermined register signals are MRS or EMRS signals.

12. The memory system of claim 9, wherein each of the plurality of multiplexers is configured to output any one of the signals of the first pin group as the rank pin signal in response to one of the plurality of register signals that is activated.

* * * * *